| United States Patent [19] | [11] Patent Number: 4,833,005 |
|---|---|
| Klaar et al. | [45] Date of Patent: May 23, 1989 |

[54] LAMINATE OF FIBER-REINFORCED, CROSSLINKED POLYPROPYLENE

[75] Inventors: Karlo Klaar, Troisdorf-Sieglar; Paul Spielau, Troisdorf-Eschmar; Werner Kuhnel, Neunkirchen-Schoneshof, all of Fed. Rep. of Germany

[73] Assignee: Dynamit Nobel Aktiengesellschaft, Troisdorf, Fed. Rep. of Germany

[21] Appl. No.: 127,956

[22] Filed: Dec. 2, 1987

[30] Foreign Application Priority Data

Dec. 3, 1986 [DE] Fed. Rep. of Germany ....... 3641342

[51] Int. Cl.$^4$ ................. B32B 15/08; B32B 27/12; B32B 27/32; B32B 31/20; H05K 1/03
[52] U.S. Cl. ................. 428/224; 156/228; 156/288; 156/307.7; 156/902; 174/68.5; 361/397; 428/251; 428/252; 428/263; 428/272; 428/273; 428/285; 428/286; 428/287; 428/288; 428/290; 428/451; 428/461; 428/901
[58] Field of Search ............... 428/224, 251, 252, 263, 428/272, 273, 285, 286, 287, 288, 290, 451, 461, 901; 361/397; 174/68.5; 156/228, 288, 307.7

[56] References Cited

U.S. PATENT DOCUMENTS

| 4,035,694 | 7/1977 | Barton et al. | |
|---|---|---|---|
| 4,268,339 | 5/1981 | Urban . | |
| 4,502,263 | 3/1985 | Crass et al. | 428/451 |
| 4,595,625 | 6/1986 | Crass et al. | 428/451 |
| 4,639,398 | 1/1987 | Bergstrom | 428/451 |
| 4,716,068 | 12/1987 | Seifried | 428/451 |
| 4,734,317 | 3/1988 | Bothe | 428/451 |

FOREIGN PATENT DOCUMENTS

| 0194381 | 9/1986 | European Pat. Off. . |
|---|---|---|
| 2151270 | 4/1972 | Fed. Rep. of Germany . |
| 3243925 | 5/1984 | Fed. Rep. of Germany . |
| 3411973 | 10/1984 | Fed. Rep. of Germany . |

OTHER PUBLICATIONS

Saure, Manfred: Kunststoffe in der Elektrontechnik, AEG-Telefunken; Handbuch Band 22, Berlin und Frankfurt 1979, pp. 146–150.

Kabel und Isolierte Leitungen, VDI-Verlag Dusseldorf, 1984, pp. 152–163.

*Primary Examiner*—James C. Cannon
*Attorney, Agent, or Firm*—Antonelli, Terry & Wands

[57] ABSTRACT

A laminate is made of textile sheet structures of synthetic fibers or glass fibers with a covering of polypropylene. The polypropylene is crosslinked by addition of crosslinking agents. The laminate has good electrical insulating properties, perfect solder bath stability, and good mechanical machinability. This laminate is provided, in heated presses, with metal layers or can be provided, in heated presses, with metal layers or can be provided with such metals layers by the application of metallic foils or by electrolytical methods, and serves for the manufacture of printed circuits and ribbon cables. An advantageous production of the textile sheet structures encased with crosslinked polypropylene can be performed on roll stands by thermoplastic encasing and smoothing in a continuous process.

15 Claims, No Drawings

LAMINATE OF FIBER-REINFORCED, CROSSLINKED POLYPROPYLENE

This invention relates to a laminate for the manufacture of printed circuits and corresponding flat structures from one or more conductor layers and one or more insulating layers, consisting of one or more impregnated cover and core layers containing impregnants that are novel for this purpose.

Laminates serve predominantly as substrates of printed circuits or the like and are made up of identical or different, resin-impregnated sheets which are cut into leaves or panels, superimposed in layers, and, under the effect of heat and pressure, joined to form a unit and solidified. Numerous resin binders for the panel materials are known for layered pressmolded materials, also called laminates and, respectively, multilayer materials, in order to satisfy, in particular, maximum requirements with respect to physical electrical and chemical properties. Laminates constitute an indispensable basic material of modern electronics, as described, for example, by K. Borchert, "Elektroanzeiger Essen" [Electrician's News Essen], No. 18: 27–30 (1966). The reinforcing substrate layers used for the binder resins are predominantly glass fabric sheets, also paper sheets, where glass-fiber-reinforced epoxy resin laminates result in the highest quality laminates. The laminates can be covered on one or both sides by laminating with a metallic foil or copper or aluminum, or can be provided with metal layers by electrochemical methods. Laminates can carry for the inner plies of the up to 10 core layers, as well as for the outer plies of the cover layers a uniformly identical substrate material and the same resin, or different substrate materials and/or reinforcing layers of glass fabric, glass mats, glass paper, paper or cellulose materials, polyester knits, asbestos fibers, or the like, and various resin coats which as a rule are condensation resins. The manufacture requires according to the state of the art a wet impregnation with resin solutions, drying and preliminary condensation, final condensation, and lastly press-molding in heated presses to which several layers are subjected, with the resins being condensed.

Laminates of the conventional type, in spite of their absolute indispensability, exhibit a number of drawbacks and entail a cumbersome manufacturing procedure due to the necessity of condensation of the resins and a cumbersome handling during press-molding of the numerous layers. Laminates with glass fiber reinforcement are furthermore difficult to machine mechanically, for example by drilling, cutting or punching, especially since high precision is required in the production of printed circuits. Attempts have been made to improve machining by combining glass-fiber-reinforced layers with core layers of paper-bound sheets. Also, the same laminate plies have been utilized with a different resin binding, wherein also polyesters can replace the epoxy resins and wherein synthetic fiber materials have been used. Further, core layers have been suggested made of hardened synthetic resin foams with closed cells and cover layers of resin-impregnated fiber plies.

However, there is always the disadvantage that the condensation resins and the numerous layers bring about a high rigidity of the laminate, and a yieldability and flexibility, desired in many cases, are either difficult to achieve or unattainable with the known materials.

Therefore, an object of the present invention resides in producing, in a simple way a laminate, or corresponding flat structure provided with metal layers and containing a fiber reinforcement, exhibiting especially favorable electrical properties, such as low relative permittivity (dielectric constant) and a low dissipation factor, as well as improved mechanical machinability.

Optionally, synthetic resin materials are to be employed which heretofore have not served for the production of printed circuit laminates. In particular, a good and improved solder bath stability according to DIN-IEC 52 is to be achieved wherein, at 260° C., the specimen is stored floating on liquid solder and tested for changes. It has been found surprisingly that crosslinked polypropylene in conjunction with fibers that can be melted as well as fiber that cannot be melted withstands the required high temperatures for an adequate length of time and thus meets the requirement of good soldering ability.

Furthermore, numerous improvements in quality have been found, in particular a substantially enhanced mechanical workability by punching, cutting, drilling, or the like. The manufacturing method is different and substantially simplified.

Consequently, the invention relates to a laminate containing a uniquely crosslinked polypropylene as a binder resin.

Another aspect of the invention resides in a process for the manufacture of these laminates.

It has been found surprisingly that polypropylene, which per se cannot be crosslinked, or can be crosslinked only with great difficulties and with a low crosslinking density, exhibits in accordance with this invention a degree of crosslinking of at least 30% and, with certain measures, a degree of crosslinking in the range of 70–90%, especially if certain measures according to the invention work together. In particular, when producing the laminates in the hot press, temperatures should be maintained of at least 200°–230° C. for an adequate time period, on the order 0.2 to 5.0 minutes, but these temperatures can also be exceeded somewhat, depending on the temperature stability of the laminates. Furthermore, a prerequisite for adequate crosslinking is the choice of crosslinking materials, especially the cooperation of specific silanes, specific peroxides, hereinafter described, and the preferred use of silanol condensation catalysts based on tin compounds. Moreover, the type of polypropylene employed also exerts a substantial influence.

In particular, it has been discovered, surprisingly, that the molecular weight of the polypropylene homopolymer or of the copolymers should be higher than $5 \times 10^5$; thus surprisingly a very high molecular weight material, is a prerequisite for an adequate crosslinking density. With very great preference, the so-called partially crystalline, isotactic homopolymer of propylene, or corresponding copolymers, are utilized, which have crystalline proportions. Further influence is exerted by the melt flow index of the polypropylene, in such a way that polypropylene having a melt flow index MFI (230/5) of 3 can be crosslinked only up to a degree of crosslinking of about 30%; whereas, material having an MFI of about 1 exhibits a degree of crosslinking of up to 70%, and polypropylene with an MFI (230/5) of 0.1–0.3 g/10 min permits attainment of practically complete crosslinking, with a crosslinking degree in the range of 70–95%. The degree of crosslinking is here measured by determining the insoluble proportion in * according to the standard method.

* "Decalin"=solvent consisting of Decahydromaphthaline

It is not necessary to achieve complete crosslinking for the purposes of the present invention.

The laminates of this invention can be of a multilayer structure or the laminates are preferably one-ply, which entails considerable simplifications of the manufacturing process as compared with conventional laminates. The laminates can be covered by laminating on one side or on both sides with a metal foil, in particular a copper foil or optionally an aluminum foil, if desired with the presence of an adhesion promoter as an intermediary. Also, intermediate layers of metallic foils are possible. In case of multilayer materials, the various layers can contain various polypropylenes, can exhibit differing crosslinking densities, or can contain different reinforcing layers. Furthermore, the concomitant use of conventional layers made of resin-impregnated laminates, so-called prepregs, is possible.

The supporting layer of the laminates or the layers thereof can consist of glass fibers or sufficiently temperature-resistant organic fibers in the form of mats, woven fabrics, knit fabrics, random layers, or the like; in case of continous production, this supporting layer can consist of lengths of these materials available in rolls.

Synthetic fiber reinforcing materials, especially those of thermoplastic synthetic resins, are to exhibit Vicat softening temperatures, measured according to DIN 53 460, procedure B, with a weight load of 5 kp, of higher than 1,200° C., and are to be meltable or, as polyacrylonitrile fibers, are not to have any melting point, but do have dimensional stability under heating in accordance with Iso/R 75 which is high and is, for example, higher than thermoplastic linear polyester.

Suitable thermoplastic synthetic resins for the reinforcing sheets are, in particular, polyesters and/or mixed polyesters, such as polybutylene terephthalate, poly-1,6-cyclohexylene dimethyl terephthalate, polyethylene terephthlate, polyethylene terephthalate adipate and/or poly-butylene terephthalate adipate. Furthermore, suitable for this purpose are polyimides and polyamides, among these polyarylamides. Further, suitable fibers can be made of polyacrylonitrile and/or styrene-acrylonitrile. Also, suited are fibers of polysulfone, polyether sulfone, polyacrylic ethers, polyphenylene sulfide, modified polyphenylene oxide and/or polyparahydroxybenzoate.

The carrier layers or reinforcing layers can also be built up of two different fibers; moreover, so-called bicomponent fibers can be employed. In many cases, glass fibers or mineral fibers are preferred. An advantageous embodiment of the reinforcing layers can be made up on the basis of polyethylene terephthalate or polybutylene terephthalate or poly-1,6hexylene terephthalate, or copolyesters of terephthalic acid with a second dicarboxylic acid, e.g. isophthalic acid and/or aliphatic saturated dicarboxylic acids of 2-6carbon atoms. The substrate can also contain, for example, bicomponent fibers, i.e. one of the aforementioned sheet-like structures, provided with an additional bond or reinforcement by molten fibers, strips, powder, or the like of thermoplastic synthetic resins, for example polyethylene terephthalate or copolyesters; amounts of up to 30% by weight, based on the sheet-like structure, can be present. It is also possible to use, as binders in the form of a powder spread onto sheets, or as additionally applied fibers, polyacrylates, polyvinyl acetates, polyvinyl propionate, polyurethane, melamine resins, ureaformaldehyde resins and/or phenolic resins, whereby heat-setting of even thin mats can be attained.

The invention especially resides in a process, wherein polypropylene homopolymer or propylene-ethylene copolymer of up to 12% by weight of ethylene, containing 5 to 60 wt.-% of textile or fiber reinforcement, the balance of 40 to 95 wt.-% being polypropylene material, the polypropylene material having a molecular weight of higher than $5 \times 10^5$ and the MFI melt flow index (230/5) being then 0.1 to 3.0 g/10 min. is worked for 0.2 to 10 min. at 200° to 230° in the presence of 0.1 to 5.0 wt. %, based on the amount of polypropylene material, of said alkoxy-silane of said formula and 0.1 to 0.4 wt.-%, based on polypropylene material, of one or more peroxides having a one-minute half-life temperature of about 160° to 240° C., this will lead to laminates of sufficient degrees of crosslinking of 30 to 95%, measured by determining the insoluble portion in decahydronaphthaline, said laminates thus being no longer thermoplastic but becoming duroplastic thus now being stable in a solder bath of 260° C. for more than 20 seconds.

The invention resides also in the so produced laminates, wherein the polypropylene material is silane grafted and cross-linked.

The quantity of textile or fiber reinforcements for the binder containing layers of the laminates is to be 5–60% by weight, preferably 7–45% by weight, with the balance being polypropylene binder thereby achieving the desired flexibility or rigidity of the laminate, as well as one the necessary electrical properties.

Suitable crosslinking is possible, especially by the addition of silanes, preferably together with organic peroxides of a suitable kind and furthermore preferably together with silanol condensation catalysts based on tin compounds. Amounts of the silanes added range from 1.0–5.0% by weight, based on the polypropylene employed. Suitable silanes are, in particular, alkoxy silane compounds having the formula:

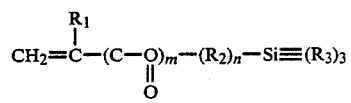

wherein $R_1$ is hydrogen or an alkyl radical of 1-4 carbon atoms; $R_2$ is a straight-chain alkylene radical of 1-10 carbon atoms; $R_3$ is an alkoxy radical of 1-5 carbon atoms which can optionally be interrupted by an oxygen atom; and m and n are equal to 0 or 1. Among these, preferred are γ-methacryloxypropyl-trimethoxysilane, γ-acryloxypropyltrimethoxysilane, as well as the corresponding triethoxysilanes. Further, suitable silanes are identified in the examples. A suitable selection of the silanes is possible, those having boiling points higher than 150° C. being preferred, and furthermore, silanes which contain acrylic groups, methacrylic groups, and vinyl groups, but also alkoxy groups are split off in a suitable way and bring about crosslinking.

Preferably, silanes are used together with peroxides. The amounts of peroxide are to amount preferably to 0.1 –0.8% by weight, based on the polypropylene employed. A suitable choice of the peroxides is possible based on their half-life temperature of about 160°–240° C. Dicumyl peroxide is highly preferred, also because of easy availability. Further suitable peroxides are set forth in the examples.

An especially suitable silanol condensation catalyst is dibutyltin dilaurate. *

* Generally silanol condensation catalysts are dialkyl tin dicarboxylates of saturated fatty acids of 10 to 18 C-atoms (alkyl=$C_2$ to $C_6$), which may be abient or are preferably added in amounts of 0.02 to 1.5 wt.-% referred to polypropylene material.

It has been found surprisingly that the laminates of this invention exhibit low numerical values for the dissipation factor and thus highest insulating effect, as well as very low relative permittivities. The solder bath stability, depending on amount and type of the fiber material, is high. There is the great advantage of being able to set the stiffness of the material or the flexibility at intentional values, and also to be able to select thin layer thicknesses. The laminates according to the invention can be provided, especially when serving as substrate material for printed circuits, with metal or wires on the surface or inside during the production process, layers, or the laminates can be provided subsequently with metallic layers by adding metal foils or wires or by means of electrochemical methods. Furthermore, it is especially possible in this way to advantageously manufacture ribbon cables, i.e. metallic conductor paths arranged in parallel and preferably of a flat structure, with a joint covering of layers of the laminate according to this invention and terminals at each end of a conductor path.

The manufacturing process deviates from the customary production methods for laminates as follows:

First of all, a premix is to be prepared from the aforementioned polypropylene and the crosslinking agents, in finely divided form by mixing or by compounding and subsequent granulating; during this step, suitable, finely divided fillers, flame retarders, pigments, stabilizers, antioxidants, etc., can also be added.

For a production of a small number of pieces, the process resides in strewing granules or powder made up of the aforementioned components onto the mold surfaces of the heated presses usually employed in laminate production, at temperatures of 170°–240° C. and under pressure of 10–200 bar, whereupon the reinforcing layer is inserted and again granules or powder is or are spread on. One or several metal layers can be inserted; also, several layers of granulated material or powder and several layers of reinforcement are possible. It is likewise possible to manufacture several laminate plates simultaneously, if corresponding separating layers are utilized.

However, it is more expedient to encase an endless substrate sheet, covered with the crosslinking polymer, n suitable coating units by press-molding to both sides the plasticized polymers which exit, for example, from an extruder slot die.

Especially suitable is a cluster roll stand with 3 or 4 rolls including a subsequently connected smoothing device. In this way, lengths of sheet containing the substrate can be prefabricated in a suitable way, these lengths of sheets having been partially crosslinked already.

In the aforementioned heated presses, sections of these sheet lengths or packs of thin sheet sections are then press molded together with an arbitrary number of metal foils and are crosslinked in the desired way during the press molding step. Presses with automatic feeding and discharging are preferred.

Examples 1 and 2

A mixture of 100 parts by weight of polypropylene with an MFI (230/5) of <0.3 g/10 min and 1.2 parts by weight of γ-methacryloxypropyltrimethoxysilane and 0.4 part by weight of dicumyl peroxide and 0.05 part by weight of dibutyltin dilaurate and 0.3 part by weight of an antioxidant * is homogeneously blended and, in a mold, uniformly spread on the bottom and, after placing thereon a glass mat having a $m^2$ weight of 80 g (Example 1) and, respectively, 227 g (Example 2), on this glass mat, and the resulting composite is heated up in a press under 100 bar to 230° C. within 5 minutes. In a second working step, the single-layer laminates are bonded by laminating to a 0.035 mm copper foil at 200° C. and under 60 bar. The properties of these copper-laminate layered materials are listed in Table 1.

* Irganox 1010 = polycyclic phenol

Examples 3 and 4

The crosslinking polypropylene mixture mentioned in Examples 1 and 2 is fed to an extrusion device with 2 extruders and a 4-roll smoothing stand. Extrusion takes place with a mass temperature of 220°–230° C. A nonwoven glass mat of endless glass fibers having a $m^2$ weight of 80 g (Example 3) and, respectively, a glass mat of 660 g (Example 4) is fed into the first slot of the 4-roll smoothing unit. Penetration of the nonwoven glass mat with the polypropylene is effected from fishtail dies on both sides of the fiber web. Subsequently, the resultant sheet is cut to size and, as described in Examples 1 and 2, laminated to a copper foil.

The properties obtained are also shown in Table 1.

It is correspondingly possible to layer several plies of sections of thin sheets in the press, one on top of the other, and provide these plies with a copper foil or with several layers of copper foil. Furthermore, additional layers of conventional, resin-bound prepregs with reinforcements of glass fiber, synthetic fibers, paper, or the like, can be inserted in the press.

TABLE 1

|  | Ex. | | | |
|---|---|---|---|---|
|  | 1 | 2 | 3 | 4 |
| Thickness (mm) | 0.65 | 0.59 | 0.91 | 1.55 |
| Proportions of glass (% by weight) (**) | 13.6 | 34 | 7.2 | 38 |
| Dissipation factor (tan $f \times 10^{-4}$ (*)) | 132 | 15 | 28 | 46 |
| Relative permittivity Er (*) | 2.40 | 2.59 | 2.27 | 2.4 |
| Solder bath stability (sec) at 260° C. acc. to DIN-IEC 52 | >180 | >180 | >180 | >180 |

(*) At $10^6$ Hz after storage in climate chamber for 96 hours at 40° C. and 92% relative atmospheric humidity according to DIN 53 483.
(**) Balance polypropylene

Examples 5–9

The laminating process is conducted according to the same procedure as described in Examples 1 and 2 with polyester nonwoven mats based on polyethylene terephthalate having the following $m^2$ weights:

Ex. 5: 250 g/$m^2$ (polyethylene terephthalate)
Ex. 6: 140 g/$m^2$ (polyethylene terephthalate)
Ex. 7: 135 g/$m^2$ (polyethylene terephthalate)
Ex. 8 200 g/$m^2$ (polyethylene terephthalate)
Ex. 9: 120 g/$m^2$ (polyethylene terephthalate)

The properties are illustrated in Table 2.

TABLE 2

|  | Ex. | | | | |
|---|---|---|---|---|---|
|  | 5 | 6 | 7 | 8 | 9 |
| Thickness (mm) | 0.65 | 0.62 | 0.54 | 1.58 | 0.58 |

TABLE 2-continued

| | Ex. | | | | |
|---|---|---|---|---|---|
| | 5 | 6 | 7 | 8 | 9 |
| Proportion of polyester nonwoven mat (% by wt) (**) | 37.8 | 26.2 | 29.1 | 33.9 | 28.2 |
| Dissipation factor tan $\int \times 10^{-4}$ (*) | 71 | 67 | 27 | 34 | 22 |
| Relative permittivity Er (*) | 2.49 | 2.36 | 2.42 | 2.44 | 2.36 |
| Solder bath stability (sec) at 260° C. acc. to DIN-IEC 52 | 30 | 20 | 25 | 20 | 22 |

(*) Measuring method as stated above.
(**) Balance polypropylene

Examples 10–13

Laminates are produced as set forth in Examples 1 and 2, but using, in place of the nonwoven glass mats employed, fabrics of aramid, e.g. Kelvar (registered trademark of Dupont) having varying m² weights and differing fabric weaves:

Ex. 10: linen weave 220 g/m²
Ex. 11: twill weave 220 g/m²
Ex. 12: linen 161 g/m²
Ex. 13: linen 80 g/m²

The material proportions and properties are indicated in Table 3.

TABLE 3

| | Ex. | | | |
|---|---|---|---|---|
| | 10 | 11 | 12 | 13 |
| Thickness (mm) | 0.88 | 0.88 | 0.70 | 0.70 |
| Proportion polyarylamide aramid (% by weight) (**) | 28.7 | 30.0 | 25.4 | 12.6 |
| Dissipation factor tan $\int \times 10^{-4}$ (*) | 97 | 48 | 46 | 88 |
| Relative permittivity Er (*) | 2.14 | 2.19 | 2.28 | 2.24 |
| Solder bath stability (sec) at 260° C. acc. to DIN-IEC 52 | 30 | 40 | 25 | 20 |

(*) Measuring method as indicated previously.
(**) Balance polypropylene

Examples 14–17

Polypropylene (PP-H) having an MFI at 230/5 of 0.3 g/10 min is processed together with various peroxides and silanes according to Example 4 on a 3-roll stand with subsequently connected smoothing rollers. In Example 17, a propylene copolymer (PP-CO) containing 8% by weight of ethylene is processed together with vinyltrimethoxysilane and γ-methacryloxpropyltrimethoxysilane, and peroxide A. Depending on the setting of the roll nips, sheet material having thicknesses of 0.2 to 1.5 mm can be obtained; this material is cut and then laminated in a press with copper or Al foil. The electrical values correspond to those of Table 4.

TABLE 4

| | Examples | | | |
|---|---|---|---|---|
| | 14 | 15 | 16 | 17 |
| PP, parts by weight* | 100 | 100 | 100 | PP-CO 100 |
| VTMO | 2 | 1.0 | 2.0 | 1.0 |
| DBTL | 0.04 | 0.05 | 0.06 | 0.05 |
| Memo | | 1.0 | | 1.0 |
| Peroxide A | 0.4 | | | 0.5 |
| Peroxide B | | | 1.0 | |
| Peroxide C | | 0.4 | | |
| Degree of crosslinking | 62 | 80 | 75 | 70 |

TABLE 4-continued

| | Examples | | | |
|---|---|---|---|---|
| | 14 | 15 | 16 | 17 |
| after lamination | | | | |

Peroxide A = tert-butylperoxy(3,5,5-trimethyl)hexoate
Peroxide B = bis-C—tert-butylperoxyisopropylbenzene
Peroxide C = dicumyl peroxide
VTMO = vinyltrimethoxysilane
Memo = γ-methacryloxypropyltrimethoxysilane
*pp is polypropylene homopolymer in the examples 14 to 16, but in example 17 a propylene-ethylene-copolymer (50:50 wt. % mixture of a copolymer of 10 wt. % ethylene and 90 wt. % propylene and a copolymer of 3 wt. % ethylene and 97 wt. % propylene).

What is claimed is:

1. A laminate of substrate material for printed circuits which comprises at least one fiber-reinforced support layer, said support layer having a flat structure that is formed of synthetic organic fibers and/or of glass fibers and that is penetrated by a polypropylene material containing crosslinking agent, said laminated exhibiting relative permittivity φr at 20° C. and 10⁶ Hz of smaller than 3, dissipation factor tan δ at 20° C. and 10⁶ Hz, measured after storing for 96 hours under a climate of 40° C. and 92% relative atmospheric humidity (DIN 53483) of <0.02, and a solder bath stability >20 seconds, measured at 260° C. (DIN IEC 52); said crosslinking agent comprising 1.0–5% by weight, based on the amount of polypropylene material, of an alkoxy-silane compound of the formula:

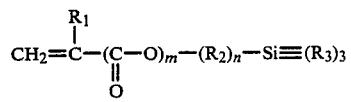

wherein
- $R_1$ is hydrogen or an alkyl radical of 1–4 carbon atoms;
- $R_2$ is a straight-chain alkylene radical of 1–10 carbon atoms;
- $R_2$ is a straight-chain alkylene radical of 1–10 carbon atoms;
- $R_3$ is an alkoxy radical of 1–5 carbon atoms which can optionally be interrupted by an oxygen atom; and
- m and n are equal to 0 or 1.

2. A laminate according to claim 1, wherein the flat structure contains fibers in the form of a nonwoven mat, a woven fabric, or a mat formed of glass fibers, mineral fibers or synthetic fibers, having melting points of above 120° C.

3. A laminate according to claim 1, wherein said at least one support layer contains, depending on the desired flexibility or rigidity, 5–60% by weight of the reinforcing fibers, based on the total weight of the laminate.

4. A laminate according to claim 2, wherein said at least one support layer contains, depending on the desired flexibility or rigidity, 5–60% by weight of the reinforcing fibers, based on the total weight of the laminate.

5. A laminate according to claim 1, wherein, for penetration of the reinforcing fibers, said polypropylene material comprises an essentially isotactic homopolymer of propylene with a density of about 0.90–0.91 g/cm³ and a melt flow index MFI (230° C./5 kp) of smaller than 3.0 g/10 min, preferably smaller than 1.0 g/10 min, and with a molecular weight larger than 5×10⁵.

6. A laminate according to claim 3, wherein said cross-linking agent comprises 1.0–5% by weight, based on the amount of polypropylene materials, of an alkoxysilane compound of the formula:

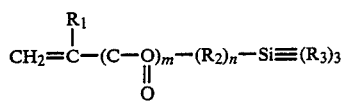

wherein $R_1$ is hydrogen or an alkyl radical of 1–4 carbon atoms; $R_2$ is straight-chain alkylene radical of 1–10 carbon atoms; $R_3$ is an alkoxy radical of 1–5 carbon atoms which can optionally be interrupted by an oxygen atom; and m and n are equal to 0 or 1.

7. A laminate according to claim 1, wherein said cross-linking agent further comprises 0.1–0.8% by weight, based on the amount of polypropylene material, of an organic peroxide having a one-minute half-life temperature of about 160°–240° C.

8. A laminate according to claim 1, wherein the cross-linking agent further comprises up to 0.1% by weight of a tin compound as a silanol condensation catalyst, based on the weight of the amount of polypropylene material.

9. A laminate according to claim 1, wherein said laminate further comprises a metal foil, bonded to at least one external layer by means of an adhesion promoter.

10. A laminate according to claim 1, wherein the polypropylene material is a polypropylene homopolymer or a polyproylene copolymer containing up to 12% by weight of ethylene.

11. A laminate according to claim 1, wherein the flat structures consist of reinforcing synthetic organic fibers, linear, saturated polyesters or copolyesters.

12. A process for the production of laminates for printed circuits which comprises forming at least two flat support layers with a bilateral covering of a film of polypropylene material comprising at least one of a homopolymer and a copolymer propylene containing crosslinking agent; and press molding the at least two layers in a heated press under a pressure of 5–200 bar into a flat structure having a thickness of 0.1–2.0 mm; said crosslinking agent comprising 1.0–5% by weight, based on the amount of propylene material of an alkoxysilane compound of the formula:

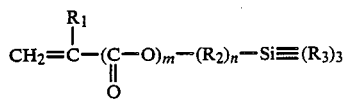

wherein $R_1$ is hydrogen or an alkyl radical of 1–4 ccarbon atoms; $R_2$ is a straight-chain alkylene radical of 1–10 carbon atoms; $R_3$ is an alkoxy radical of 1–5 atoms which can optionally be interrupted by an oxygen atom; and m and n are equal to 0 or 1.

13. A process according to claim 12, wherein the support layers are sections of continuously manufactured reinforcing sheets encased by crosslinkable or, respectively, crosslinked polypropylene.

14. A process according to claim 12, wherein the support layers, covered with polypropylene homo- or copolymer, are manufactured continuously on a cluster roll stand by introducing the polypropylene material and the crosslinking agent onto both sides of each support layer and smoothing lengths of sheeting overlying each other.

15. A process for the production of laminates according to claim 12, comprising working of polypropylene homopolymer or propylene-ethylene copolymer of up to 12% by weight of ethylene, containing 5 to 60 wt.-% of textile or fiber reinforcement, the balance of 40 to 95 wt.-% being polypropylene material, the polypropylene material having a molecular weight of higher than $5 \times 10^5$ and the MFI(melt flow index) (230/5) being then 0.1 to 3.0 g /10 min., the working is for 0,2 to 10 min. at 200° to 230° C. in the presence of 0.1 to 5.0 wt.-%, based on the amount of polypropylene material, of said alkoxy-silane of said formula and 0.1 to 0.4 wt.-%, based on polypropylene material, of one or more peroxides having a one-minute half-life temperature of about 160° to 240° C., effecting in the laminates degrees of crosslinking of 30 to 95%, measured by determining the insoluble portion in decahydronaphthaline, the so produced laminates becoming duroplastic and being stable in a solder bath of 260° C. for more than 20 seconds, and providing said laminates with a conductive metal layer.

* * * * *